(12) United States Patent
Watanabe et al.

(10) Patent No.: US 11,079,691 B2
(45) Date of Patent: Aug. 3, 2021

(54) COATING AND DEVELOPING APPARATUS AND COATING AND DEVELOPING METHOD

(71) Applicant: Tokyo Electron Limited, Tokyo (JP)

(72) Inventors: Tsuyoshi Watanabe, Koshi (JP); Masashi Tsuchiyama, Koshi (JP); Hiroki Sato, Tokyo (JP); Ippei Hamada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/030,810

(22) Filed: Sep. 24, 2020

(65) Prior Publication Data

US 2021/0103225 A1 Apr. 8, 2021

(30) Foreign Application Priority Data

Oct. 2, 2019 (JP) .............................. JP2019-182075

(51) Int. Cl.
*G03F 7/20* (2006.01)
*H01L 21/677* (2006.01)
(Continued)

(52) U.S. Cl.
CPC .......... *G03F 7/70991* (2013.01); *G03F 7/162* (2013.01); *G03F 7/7085* (2013.01);
(Continued)

(58) Field of Classification Search
CPC .............. G03F 7/70733; G03F 7/7085; G03F 7/70341; G03F 7/7075; G03F 7/70758; G03F 7/70775; G03F 7/708; G03F 7/70808; G03F 7/70825; G03F 7/70841; G03F 7/70858; G03F 7/709; G03F 7/70975; G03F 7/70991; G03F 7/70691; G03F 7/70633;
(Continued)

(56) References Cited

U.S. PATENT DOCUMENTS

| 2006/0162858 A1* | 7/2006 | Akimoto | ........... H01L 21/67184 |
| | | | 156/272.8 |
| 2006/0201616 A1* | 9/2006 | Matsuoka | ......... H01L 21/67745 |
| | | | 156/272.2 |

(Continued)

FOREIGN PATENT DOCUMENTS

JP 2010-219434 A 9/2010

*Primary Examiner* — Christina A Riddle
(74) *Attorney, Agent, or Firm* — Posz Law Group, PLC

(57) ABSTRACT

An apparatus includes: a treatment block; and a relay block including a first transfer-in/out module for an exposure apparatus. In the treatment block, a treatment module is provided in each layer, and a deliverer is provided at an end on the relay block side in the layer including a pre-exposure treatment module. In the relay block, a second transfer-in/out module for the deliverer and a post-exposure treatment module is provided in a region adjacent, in the width direction, to the deliverer, the first transfer-in/out module is provided in a relay side transfer region extending in a depth direction from a region overlapping with the second transfer-in/out module, the post-exposure treatment module is provided in a region adjacent, in an up-down direction, to the relay side transfer region and adjacent, in the depth direction, to the second transfer-in/out module, and a relay mechanism is provided.

15 Claims, 9 Drawing Sheets

(51) Int. Cl.
  *G03F 7/16* (2006.01)
  *H01L 21/67* (2006.01)
(52) U.S. Cl.
  CPC .... *G03F 7/70733* (2013.01); *H01L 21/67178* (2013.01); *H01L 21/67225* (2013.01); *H01L 21/67742* (2013.01); *H01L 21/67745* (2013.01); *H01L 21/67769* (2013.01)
(58) Field of Classification Search
  CPC ............... G03F 7/70533; G03F 7/7055; G03F 7/70725; G03F 7/162; G03F 7/20; G03F 7/16; G03F 7/26; G03F 7/2004; H01L 21/67178; H01L 21/67173; H01L 21/67184; H01L 21/67225; H01L 21/67745; H01L 21/67207; H01L 21/67703; H01L 21/67748; H01L 21/67303; H01L 21/67742; H01L 21/677; H01L 21/02307; H01L 21/67196; H01L 21/02343; H01L 21/67276; H01L 21/683; H01L 21/0273; H01L 21/6715; H01L 21/67098; H01L 21/0274; H01L 21/67115; H01L 21/6776; H01L 21/67743; H01L 21/67751; H01L 21/67769; H01L 21/67778
  USPC ...................... 355/18, 27, 30, 52–55, 67–77; 414/935–941; 430/30; 118/500, 503, 72
  See application file for complete search history.

(56) References Cited

U.S. PATENT DOCUMENTS

| 2009/0165950 | A1* | 7/2009 | Kim ................. H01L 21/67778 156/345.1 |
| 2012/0008936 | A1* | 1/2012 | Matsuoka ........... H01L 21/6715 396/611 |
| 2012/0015307 | A1* | 1/2012 | Matsuoka ................. G03F 7/16 430/325 |

* cited by examiner

COATING AND DEVELOPING APPARATUS AND COATING AND DEVELOPING METHOD

CROSS REFERENCE TO RELATED APPLICATIONS

This application is based upon and claims the benefit of priority of the prior Japanese Patent Application No. 2019-182075, filed in Japan on Oct. 2, 2019, the entire contents of which are incorporated herein by reference.

TECHNICAL FIELD

This disclosure relates to a coating and developing apparatus and a coating and developing method.

BACKGROUND

Japanese Laid-open Patent Publication No. 2010-219434 discloses a substrate treatment apparatus including: a treatment part in which a coating treatment unit for forming a resist film on a substrate and a developing treatment unit for performing a developing treatment are provided; and an interface block which is arranged between the treatment part and an exposure apparatus for performing exposure processing by the immersion method. In the substrate treatment apparatus, the interface block is composed of a transfer-in and transfer-out block and a cleaning and drying treatment block. In the transfer-in and transfer-out block, a transfer mechanism which transfers the substrate into and out of the exposure apparatus is provided. Further, in the cleaning and drying treatment block, two cleaning and drying treatment parts each of which performs cleaning and drying treatments of the substrate before the exposure processing and two substrate transfer mechanisms are provided. In the substrate treatment apparatus in Japanese Laid-open Patent Publication No. 2010-219434, the treatment part, the cleaning and drying treatment block, the transfer-in and transfer-out block, and the exposure apparatus are arranged side by side along a first direction, and the two cleaning and drying treatment parts and the two substrate transfer mechanisms are arranged along a second direction perpendicular, within a horizontal plane, to the first direction, and the two transfer mechanisms are arranged between the two cleaning and drying treatment parts.

SUMMARY

An aspect of this disclosure is a coating and developing apparatus configured to form a resist film on a substrate, transfer the substrate to an exposure apparatus, and then perform a developing treatment on the substrate subjected to liquid-immersion exposure in the exposure apparatus, the coating and developing apparatus including: a treatment block in which treatment modules including a pre-exposure treatment module configured to solution-treat the substrate after formation of a coating film including the resist film and before the liquid-immersion exposure are provided; and a relay block in which a post-exposure treatment module configured to solution-treat the substrate after the liquid-immersion exposure and before the developing treatment and a first transfer-in/out module configured to transfer the substrate into/out of the exposure apparatus are provided, and which couples the treatment block and the exposure apparatus in a width direction, wherein: in the treatment block being multilayered in an up-down direction, the treatment module is provided in each of layers, a transfer mechanism configured to transfer the substrate is provided in a transfer region extending in the width direction, and a deliverer on which the substrate is mounted when the substrate is delivered between both the blocks is provided at an end on the relay block side in the layer in which the pre-exposure treatment module is provided; and in the relay block, a second transfer-in/out module configured to transfer the substrate into/out of the deliverer and the post-exposure treatment module is provided in a region adjacent, in the width direction, to the deliverer in the treatment block, the first transfer-in/out module is provided in a relay side transfer region extending in a depth direction perpendicular to the width direction from a region overlapping, in plan view, with the second transfer-in/out module, the post-exposure treatment module is provided in a region adjacent, in the up-down direction, to the relay side transfer region and adjacent, in the depth direction, to the second transfer-in/out module, and a relay mechanism configured to relay the substrate between the first transfer-in/out module and the second transfer-in/out module is provided in a region facing the post-exposure treatment module with the second transfer-in/out module interposed therebetween in the depth direction.

DETAILED DESCRIPTION OF THE INVENTION

Figure 1:
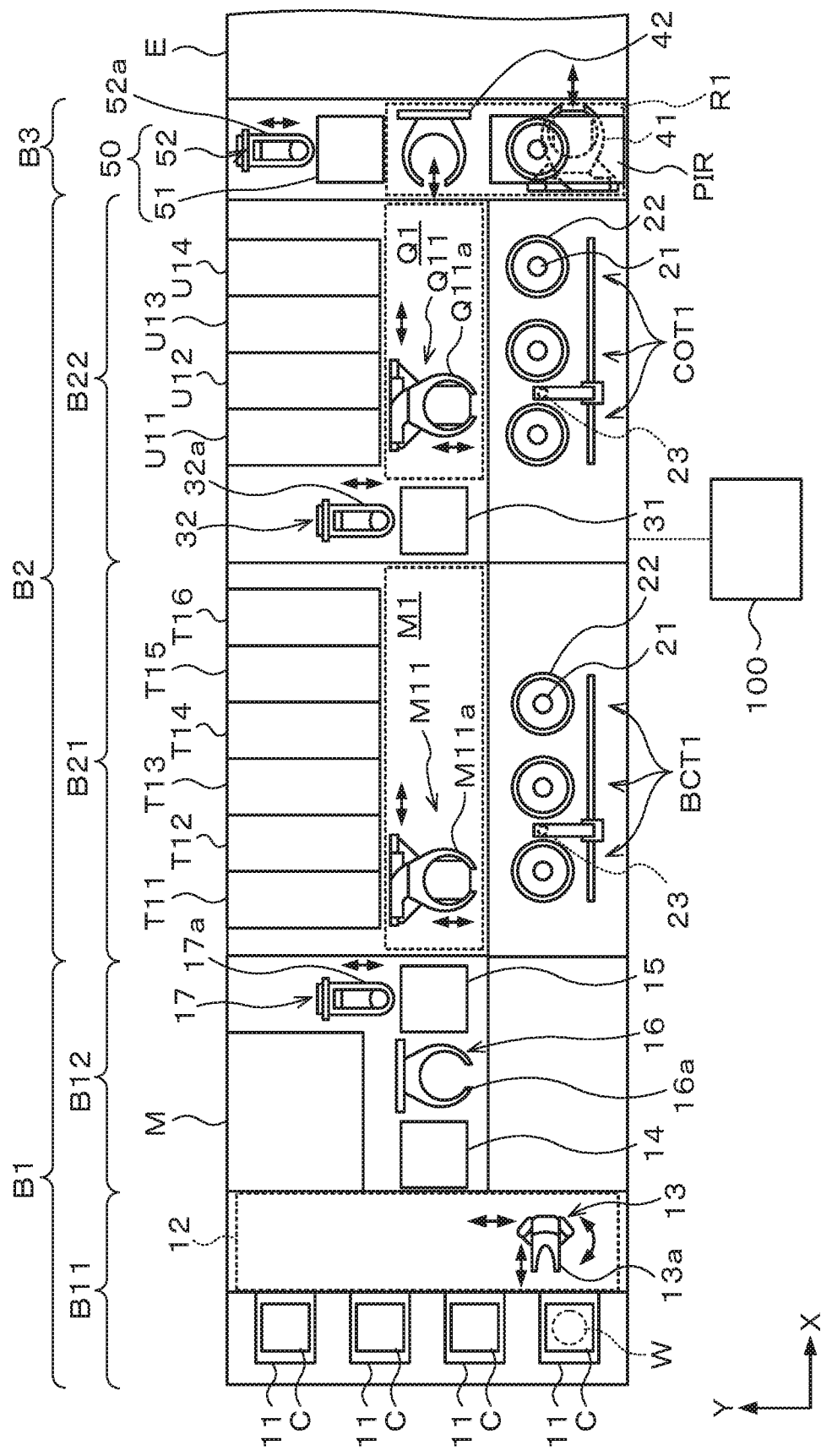
FIG. 1 is a plan view schematically illustrating the outline of a configuration of a coating and developing apparatus according to an embodiment.

In a photolithography process in a manufacturing process of a semiconductor device or the like, a series of treatments are performed to form a desired resist pattern on a semiconductor wafer (hereinafter, referred to as a "wafer"). The series of treatments include, for example, a resist coating treatment of supplying a resist solution onto the wafer to form a resist film, exposure processing of exposing the resist film, a developing treatment of supplying a developing solution to the exposed resist film to thereby develop the exposed resist film and so on. Among these treatments and processing, the resist coating treatment, the developing treatment and so on are performed in a coating and developing apparatus.

A type of the above exposure processing is liquid-immersion exposure processing. The liquid-immersion exposure is a method of performing exposure via an immersion liquid such as water between an exposure lens and the wafer. In the case of performing the liquid-immersion exposure, many types of treatment modules such as a module for forming a protective film for the liquid-immersion exposure, a module for cleaning a rear surface of the wafer before the liquid-immersion exposure processing, a module for cleaning a front surface of the wafer after the liquid-immersion exposure and so on are installed in the coating and developing apparatus.

Incidentally, higher throughput of the resist pattern formation is required. To achieve the higher throughput, the number of installed treatment modules in the coating and developing apparatus needs to be increased. However, in the case of the liquid-immersion exposure, many types of treatment modules are installed as explained above, so that when the number of installed treatment modules is increased, the apparatus increases in size. More specifically, the occupied floor area of the apparatus is increased.

In the substrate treatment apparatus in Japanese Laid-open Patent Publication No. 2010-219434, the treatment part, the cleaning and drying treatment block, the transfer-in and transfer-out block, and the exposure apparatus are arranged side by side along the first direction as explained above, the two cleaning and drying treatment parts and the two substrate transfer mechanisms are arranged along the second direction, and the two transfer mechanisms are arranged between the two cleaning and drying treatment parts. This suppresses an increase in size of the apparatus. However, the substrate treatment apparatus in Japanese Laid-open Patent Publication No. 2010-219434 is large in length in the first direction, and required to be further decreased in size.

Hence, the technique according to this disclosure provides a coating and developing apparatus capable of performing treatments at high throughput and having a small occupied area.

Hereinafter, a coating and developing apparatus and a coating and developing method according to an embodiment will be explained referring to the drawings. Note that the same codes are given to components having substantially the same functional configurations in the description and the drawings to omit duplicated explanation.

Figure 2:
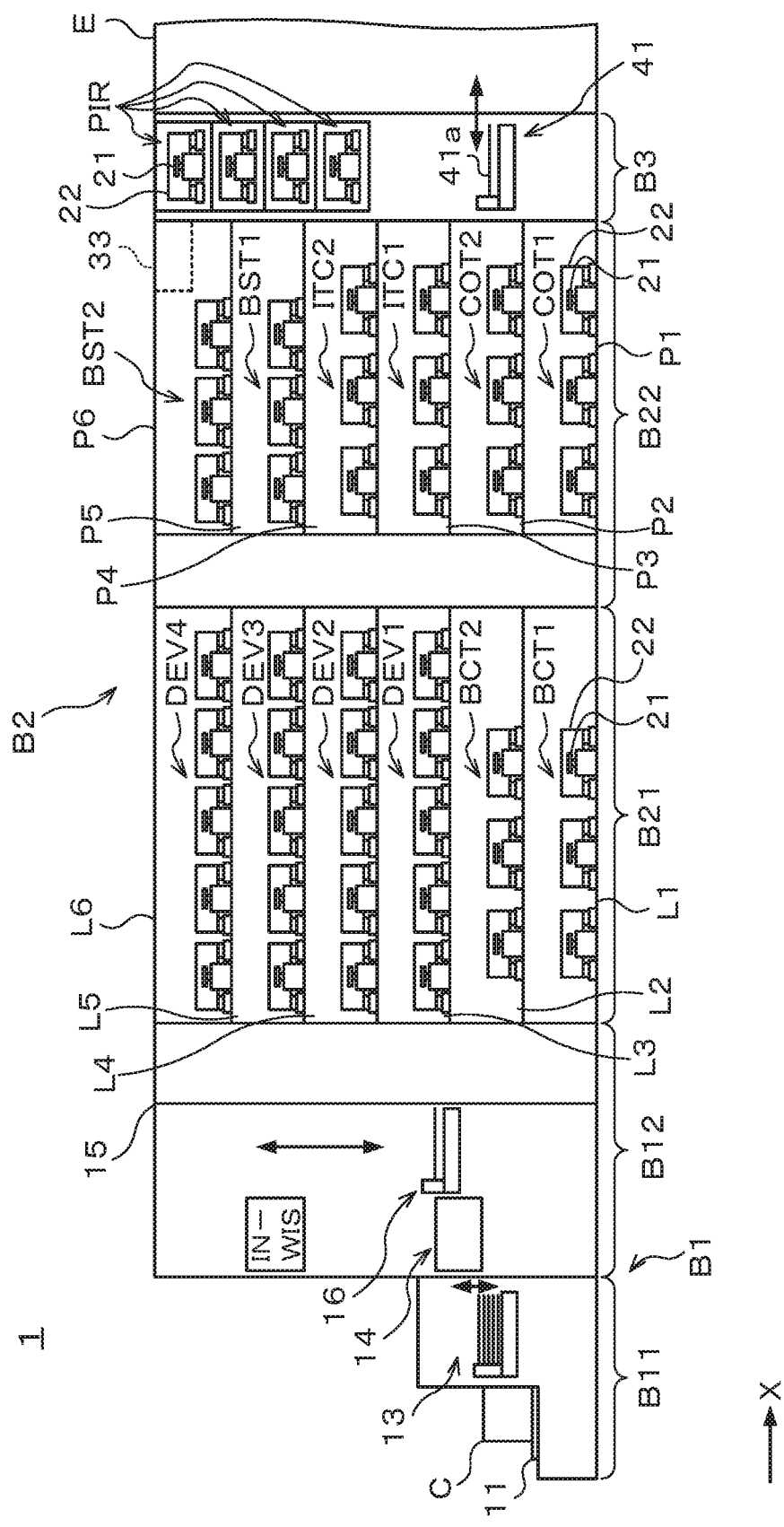
FIG. 2 is a front view schematically illustrating the outline of the configuration of the coating and developing apparatus according to the embodiment.
Figure 3:
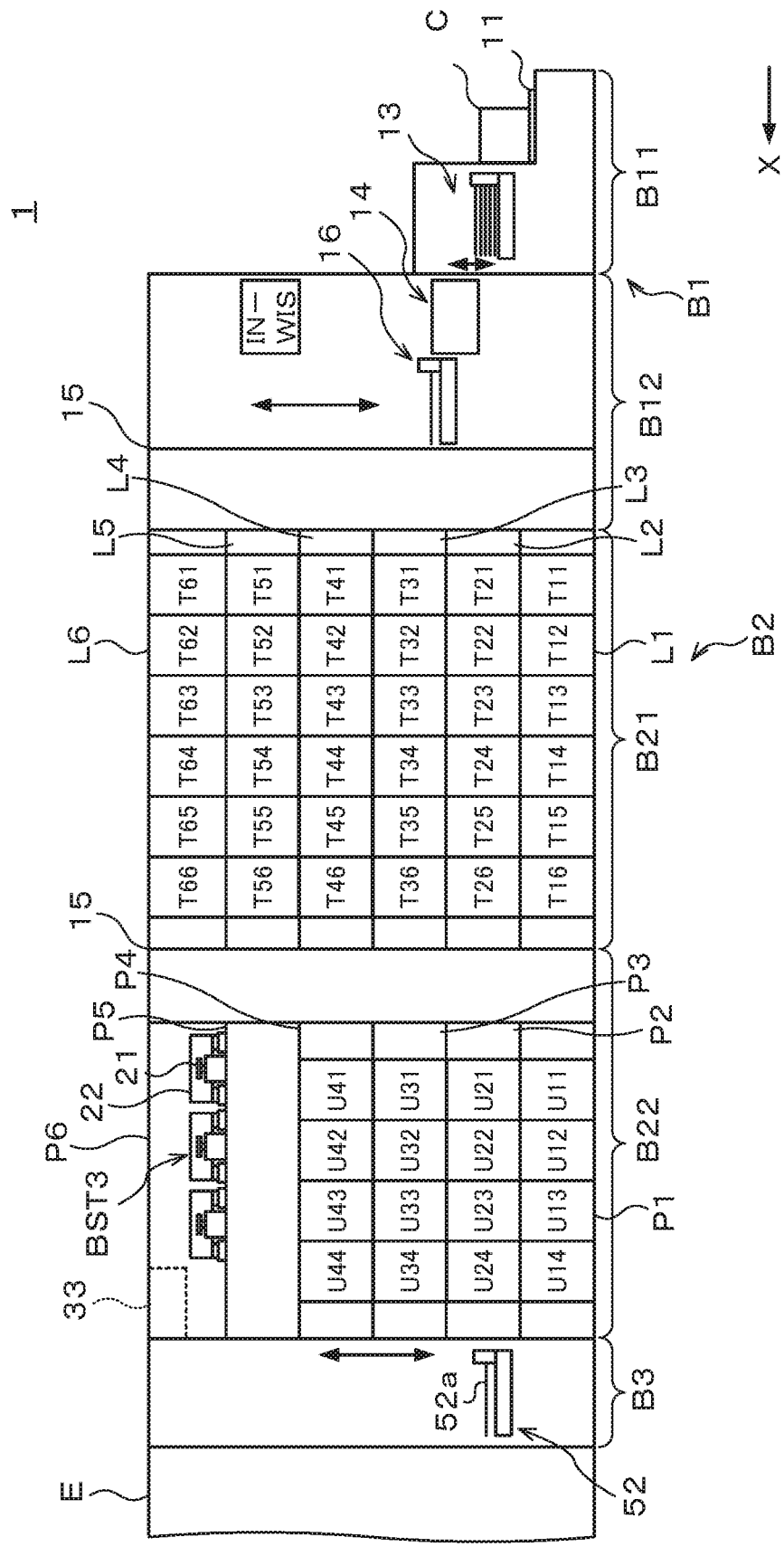
FIG. 3 is a rear view schematically illustrating the outline of the configuration of the coating and developing apparatus according to the embodiment.
Figure 4:
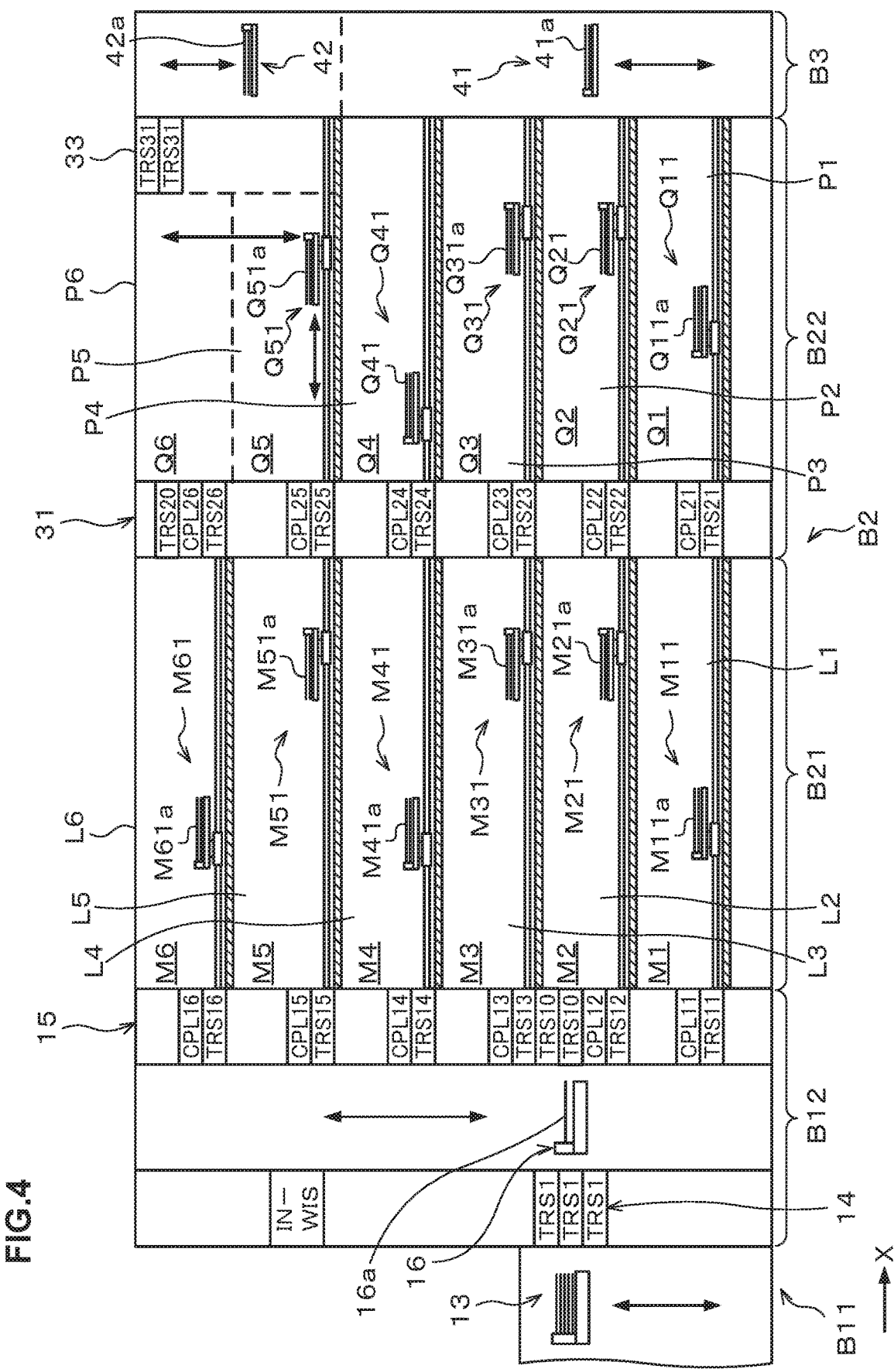
FIG. 4 is a partial longitudinal sectional front view schematically illustrating the outline of an internal configuration of the coating and developing apparatus according to the embodiment.
Figure 5:
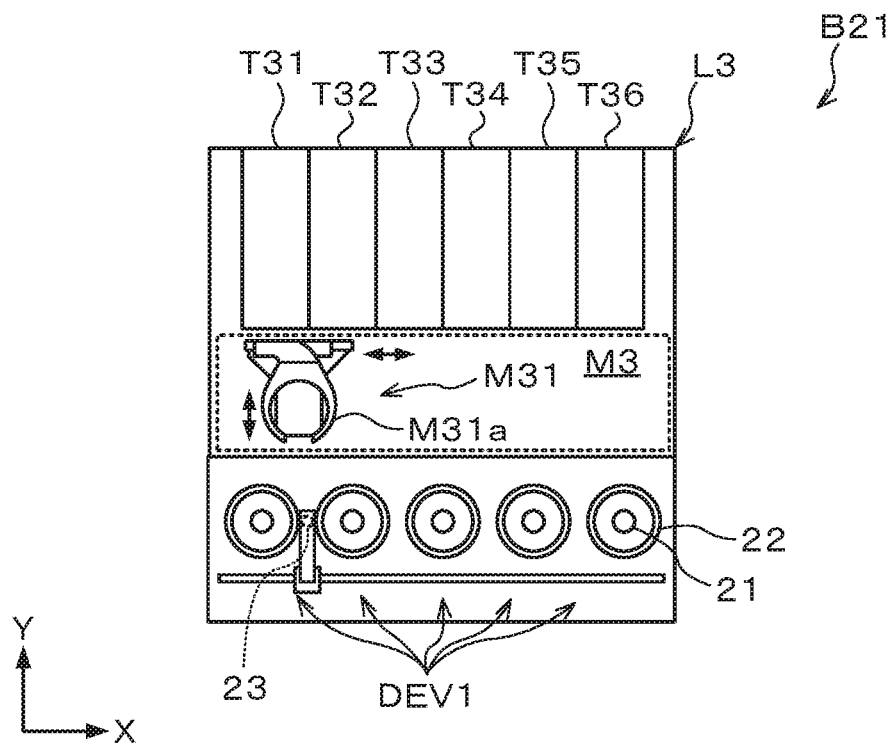
FIG. 5 is a plan view schematically illustrating the outline of an internal configuration of a third layer block included in a left sub-block of the coating and developing apparatus according to the embodiment.
Figure 6:
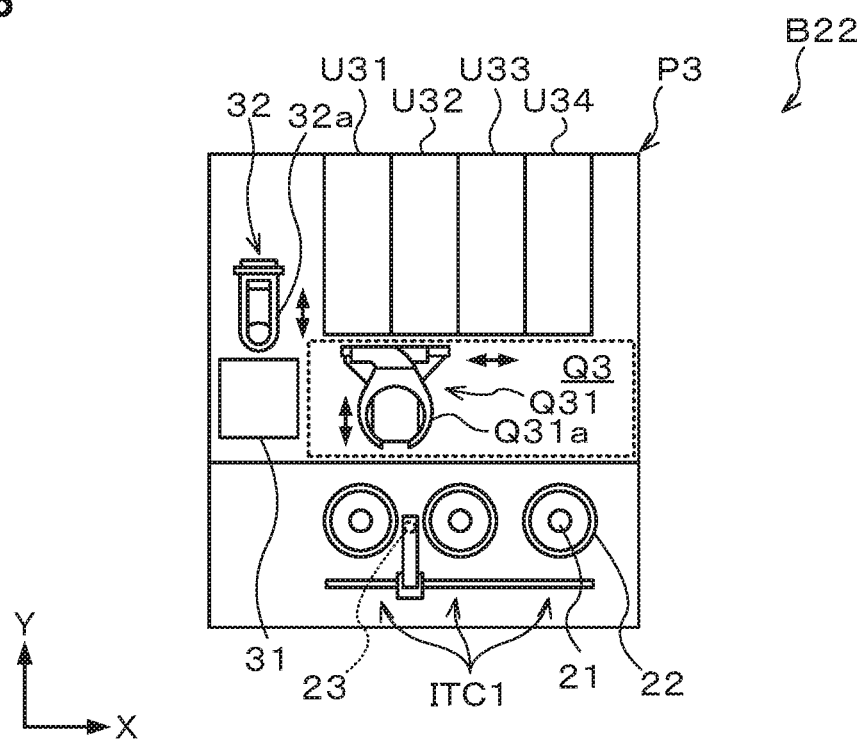
FIG. 6 is a plan view schematically illustrating the outline of an internal configuration of a third layer block included in a right sub-block of the coating and developing apparatus according to the embodiment.
Figure 7:
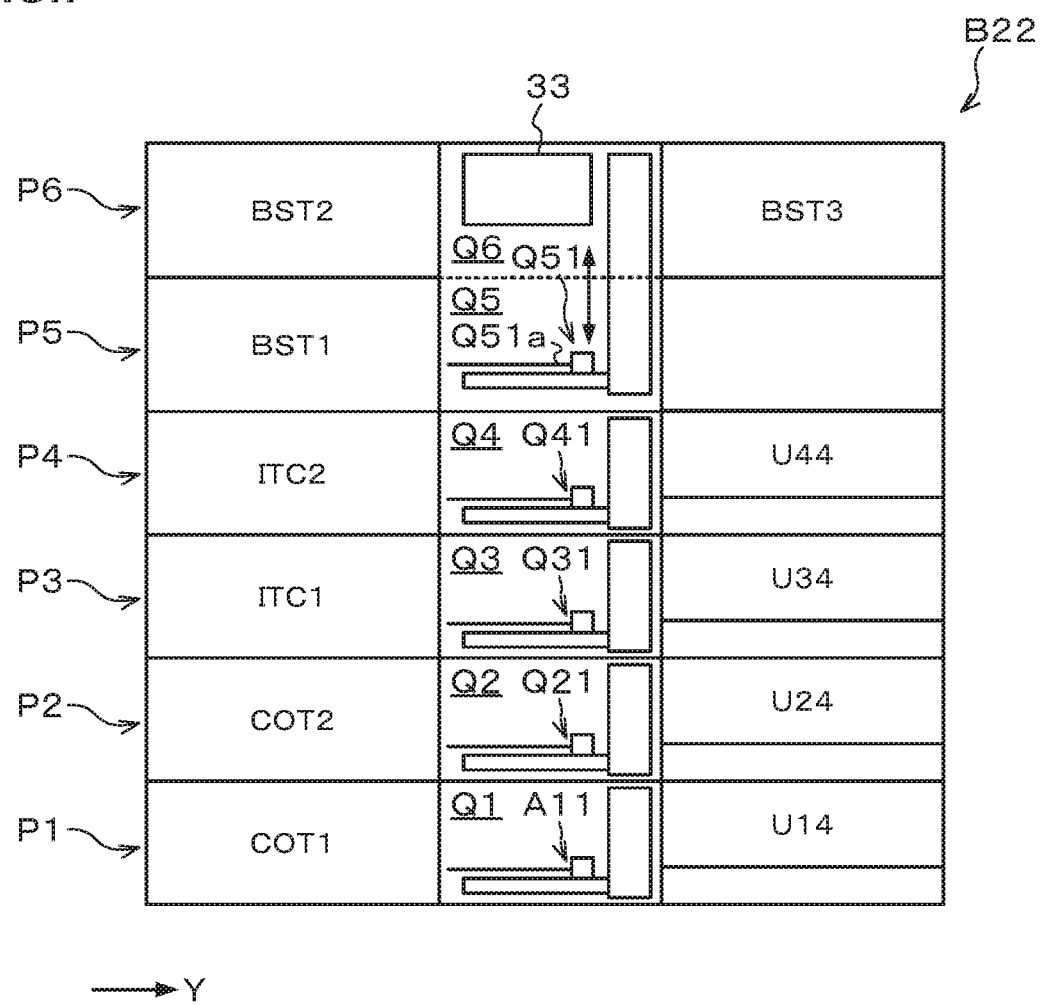
FIG. 7 is a right side view schematically illustrating the outline of a configuration of the right sub-block of the coating and developing apparatus according to the embodiment.
Figure 8:
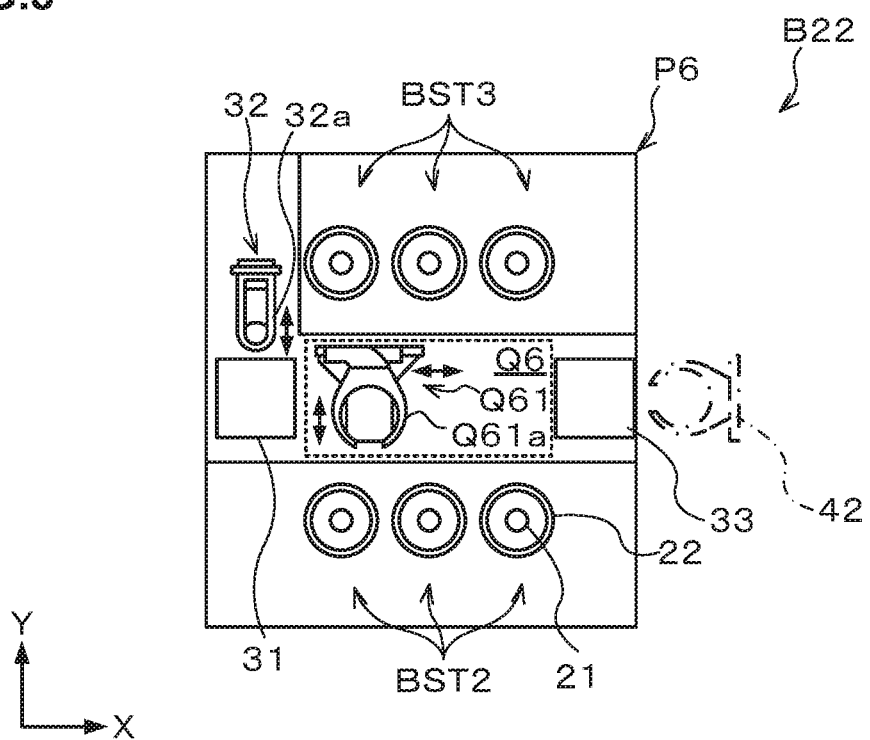
FIG. 8 is a plan view schematically illustrating the outline of an internal configuration of a sixth layer block included in the right sub-block of the coating and developing apparatus according to the embodiment.
Figure 9:
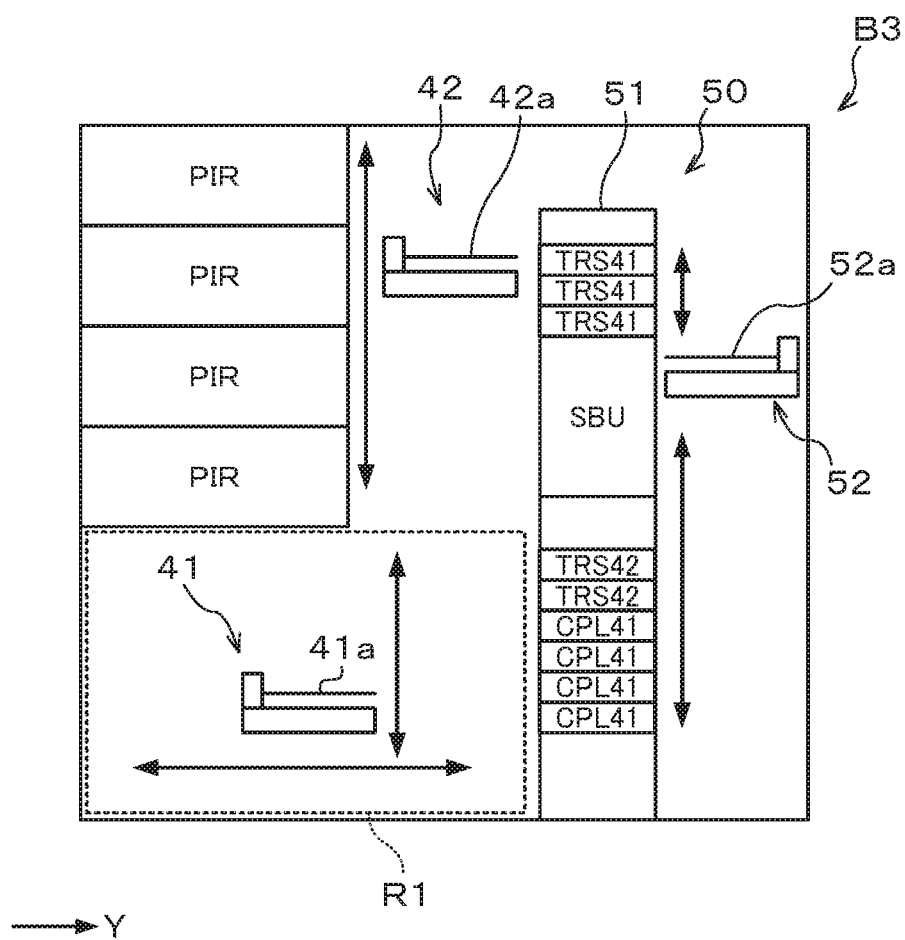
FIG. 9 is a right side view schematically illustrating the outline of an internal configuration of an interface block of the coating and developing apparatus according to the embodiment.

FIG. 1 is a plan view schematically illustrating the outline of a configuration of a coating and developing apparatus 1. FIG. 2 and FIG. 3 are a front view and a rear view schematically illustrating the outline of the configuration of the coating and developing apparatus 1, respectively. FIG. 4 is a partial longitudinal sectional front view schematically illustrating the outline of an internal configuration of the coating and developing apparatus 1. FIG. 5 is a plan view schematically illustrating the outline of an internal configuration of a third layer block included in a later-explained left sub-block of the coating and developing apparatus 1. FIG. 6 is a plan view schematically illustrating the outline of an internal configuration of a third layer block included in a later-explained right sub-block of the coating and developing apparatus 1. FIG. 7 is a right side view schematically illustrating the outline of a configuration of the right sub-block. FIG. 8 is a plan view schematically illustrating the outline of an internal configuration of a sixth layer block in the right sub-block. FIG. 9 is a right side view schematically illustrating the outline of an internal configuration of a later-explained interface block B3 of the coating and developing apparatus 1.

In the coating and developing apparatus 1, as illustrated in FIG. 1, a carrier block B1, a treatment block B2, and the interface block B3 as a relay block are provided to be arranged side by side in this order along a width direction (X-direction in the drawing). In the following explanation, the aforementioned width direction may be explained as a right-left direction. To the right side (X-direction positive side in the drawing) of the interface block B3, an exposure apparatus E is connected.

The carrier block B1 is a block into/out of which a carrier C housing a plurality of wafers W as substrates is transferred, and has a mounting block B11 and an inspection block B12.

In the mounting block B11, a mounting plate 11 is provided on which the carrier C is mounted when the carrier C is transferred in/out from/to the outside of the coating and developing apparatus 1. A plurality of (four in the example of the drawing) mounting plates 11 are provided along a depth direction (Y-direction in the drawing) perpendicular, within a horizontal plane, to the width direction (X-direction in the drawing). Further, in the mounting block B11, a wafer transfer mechanism 13 is provided which is movable along a transfer path 12 extending in the depth direction. The wafer transfer mechanism 13 has a transfer arm 13a configured to freely move back and forth, freely move up and down, and freely rotate around a vertical axis, and can transfer the wafer W between the carrier C on each of the mounting plates 11 and a later-explained delivery box 14 in the inspection block B12.

The inspection block B12 is a block which performs an inspection of the wafer W before and after the coating and developing treatments.

In the inspection block B12, the delivery box 14 is provided on the mounting block B11 side (X-direction negative side in the drawing), a delivery tower 15 is provided on the treatment block B2 side (X-direction positive side in the drawing), and a wafer transfer mechanism 16 is provided between the delivery box 14 and the delivery tower 15. The delivery box 14, the wafer transfer mechanism 16, and the delivery tower 15 are provided to be arranged side by side in this order along the width direction (X-direction in the drawing) at the middle in the depth direction (Y-direction in the drawing) in the inspection block B12, and located on an extension line of later-explained transfer regions M1 to M6, Q1 to Q6 in plan view.

The delivery box 14 is provided at a height position accessible from the wafer transfer mechanism 13 in the mounting block B11 as illustrated in FIG. 2 and FIG. 3. Further, in the delivery box 14, delivery modules TRS1 are provided in layers as illustrated in FIG. 4.

In the delivery tower 15, a plurality of delivery modules are layered in the up-down direction. In the delivery tower 15, delivery modules are provided at height positions corresponding to layer blocks of first to sixth layer blocks L1 to L6 included in a later-explained left sub-block B21 of the treatment block B2. More specifically, in the delivery tower 15, delivery modules TRS11, CPL11 are provided at positions corresponding to the first layer block L1 in the treatment block B2. Similarly, delivery modules TRS12 to TRS16, CPL12 to CPL16 are provided at positions corresponding to the second to sixth layer blocks L2 to L6. Further, in the delivery tower 15, delivery modules TRS10 each of which is used at the transfer in/out of the wafer W from/to the treatment block B2 are provided at positions accessible from the wafer transfer mechanism 16. Note that the delivery module given "TRS" and the delivery module given "CPL" are almost similarly configured, and are different from each other in that the stage on which the wafer W is to be mounted of only the latter module is formed with a medium flow path for regulating the temperature of the wafer W.

The wafer transfer mechanism 16 has a transfer arm 16a configured to freely move back and forth, freely move up and down, and freely rotate around a vertical axis. This makes it possible to transfer the wafer W between the delivery box 14 and a later-explained inspection module IN-WIS, between the delivery box 14 and a later-explained adjustment inspection apparatus M, and between the delivery box 14 and the delivery tower 15.

Besides, in the inspection block B12, the inspection module IN-WIS is provided above the delivery box 14. The inspection module IN-WIS is a module which inspects the wafer W before the coating and developing treatments and has an imaging unit for imaging the front surface of the wafer W and the like.

Further, in the inspection block B12, as illustrated in FIG. 1, the adjustment inspection apparatus M is provided on the deep side (Y-direction positive side in the drawing) of the delivery box 14 and the wafer transfer mechanism 16. The adjustment inspection apparatus M is an apparatus which inspects the wafer W subjected to the liquid-immersion exposure and the developing treatment. Based on the result of the inspection in the adjustment inspection apparatus M, for example, treatment conditions of the liquid-immersion exposure are adjusted.

Note that the near side (Y-direction negative side in the drawing) in the inspection block B12 is used as a chemical chamber, in which treatment solution bottles for storing treatment solutions used for the solution treatments and pumps for pressure-feeding the treatment solutions, and so on are accommodated.

Furthermore, in the inspection block B12, a wafer transfer mechanism 17 is provided on the deep side (Y-direction positive side in the drawing) of the delivery tower 15. The wafer transfer mechanism 17 has a transfer arm 17a configured to freely move back and forth and freely move up and down, and can transfer the wafer W among the delivery modules in the delivery tower 15.

The treatment block B2 is composed of a plurality of (two in the example of the drawing) sub-blocks B21, B22 connected in a right-left direction (X-direction in the drawing). Hereinafter, the sub-block B21 on the carrier block B1 side is called a left sub-block B21, and the sub-block B22 on the interface block B3 side is called a right sub-block B22.

The left sub-block B21 and the right sub-block B22 are each multilayered in the up-down direction and include first to sixth layer blocks L1 to L6 and first to sixth layer blocks P1 to P6, respectively, as illustrated in FIG. 2 and FIG. 3. In each layer block, various treatment modules are provided. Note that, in FIG. 1, the configurations of the first layer blocks L1, P1 are illustrated for the treatment block B2, and the first layer block L1 will be concretely explained first in the following.

As illustrated in FIG. 1, a transfer region M1 extending in the width direction (X-direction in the drawing) is formed at the middle in the depth direction (Y-direction in the drawing) of the first layer block L1 in the left sub-block B21.

A plurality of treatment modules are provided along the width direction in each of a region on one side (near side, Y-direction negative side in the drawing) and a region on the other side (deep side, Y-direction positive side in the drawing) in the depth direction with the transfer region M1 interposed therebetween in the first layer block L1.

More specifically, three anti-reflection film forming modules BCT1 are provided along the width direction (X-direction in the drawing) in the region on the near side in the first layer block L1, and vertical units T11 to T16 having treatment modules are provided in the region on the deep side.

Each of the anti-reflection film forming modules BCT1 forms an anti-reflection film on the wafer W. The anti-reflection film forming module BCT1 has a spin chuck 21 which holds and rotates the wafer W, and a cup 22 which laterally surrounds the wafer W on the spin chuck 21 and collects a treatment solution scattering from the wafer W. Further, a nozzle 23 is provided which discharges the treatment solution for forming the anti-reflection film from above toward the wafer W held on the spin chuck 21. The nozzle 23 is provided outside the cup 22 and configured to be movable among the anti-reflection film forming modules BCT1 and is shared among the anti-reflection film forming modules BCT1. A waiting section (not illustrated) where the nozzle 23 waits is provided between the cup 22 in one anti-reflection film forming module BCT1 and the cup 22 in another anti-reflection film forming module BCT1.

The vertical units T11 to T16 are provided in this order from the left side (X-direction negative side in the drawing) along the width direction. The vertical unit T11 on the leftmost side, that is, on the carrier block B1 side has an inspection module (inspection module WIS-B) which inspects the wafer W after the formation of the anti-reflection film, and the module has an imaging unit which images the front surface of the wafer W and so on. Each of the vertical units T12, T13 has hydrophobic treatment modules each of which performs a hydrophobic treatment on the wafer W, and the hydrophobic treatment modules are layered, for example, at two upper and lower stages in each of the units. Each of the vertical units T14 to T16 has heating modules each of which performs a heat treatment on the wafer W, and the heating modules are layered, for example, at two upper and lower stages in each of the units.

Further, in the first layer block L1, a wafer transfer mechanism M11 is provided in the transfer region M1. The wafer transfer mechanism M11 has a transfer arm M11a configured to freely move back and forth, freely move up and down, freely rotate around a vertical axis, and freely move in the width direction (X-direction in the drawing), and can deliver the wafer W among the modules in the first layer block L1. The transfer arm M11a can get access also to a later-explained delivery tower 31 in the right sub-block B22.

The second layer block L2 is configured similarly to the first layer block L1. Note that a transfer region provided in the second layer block L2 is denoted by M2, anti-reflection film forming modules are denoted by BCT2, and vertical units are denoted by T21 to T26 in the drawing and the like. Further, a wafer transfer mechanism provided in the transfer region M2 is denoted by M21, and a transfer arm of the wafer transfer mechanism M21 is denoted by M21a.

In the third layer block L3 in the left sub-block B21, as illustrated in FIG. 5, a transfer region M3 extending in the width direction (X-direction in the drawing) is formed at the middle in the depth direction (Y-direction in the drawing).

Five developing modules DEV1 are provided along the width direction in a region on the near side (Y-direction negative side in the drawing) of the transfer region M3 in the third layer block L3, and vertical units T31 to T36 having treatment modules are provided in a region on the deep side (Y-direction positive side in the drawing) of the transfer region M3.

Each of the developing modules DEV1 performs a developing treatment on the wafer W after liquid-immersion exposure. The developing module DEV1 also has a spin chuck 21 and a cup 22 similarly to the anti-reflection film forming module BCT1. Further, a nozzle 23 is provided which is shared among the developing modules DEV1. Note that from the nozzle 23 for the developing modules DEV1, a developing solution is discharged.

The vertical units T31 to T36 are provided in this order from the left side (X-direction negative side in the drawing) along the width direction. The vertical unit T31 on the leftmost side, that is, on the carrier block B1 side has a module (inspection module OUT-WIS) which inspects the wafer W after development, and the module has an imaging unit which images the front surface of the wafer W and so on. Each of the vertical units T32 to T36 has heating modules each of which performs a heat treatment on the wafer W, and the heating modules are layered, for example, at two upper and lower stages in each of the units.

Further, in the third layer block L3, a wafer transfer mechanism M31 is provided in the transfer region M3. The wafer transfer mechanism M31 has a transfer arm M31a configured to freely move back and forth, freely move up and down, freely rotate around a vertical axis, and freely move in the width direction (X-direction in the drawing), and can deliver the wafer W among the modules in the third layer block L3. The transfer arm M31a can get access also to the later-explained delivery tower 31 in the right sub-block B22.

The fourth to sixth layer blocks L4 to L6 are configured similarly to the third layer block L3. Note that transfer regions provided in the fourth to sixth layer blocks L4 to L6 are denoted by M4 to M6, developing modules are denoted by DEV2 to DEV4, and vertical units are denoted by T41 to T46, T51 to T56, T61 to T66 in the drawing and the like. Further, wafer transfer mechanisms provided in the transfer regions M4 to M6 are denoted by M41, M51, M61, and transfer arm of the wafer transfer mechanisms M41, M51, M61 are denoted by M41a, M51a, M61a, respectively.

The right sub-block B22 has, as illustrated in FIG. 4, the delivery tower 31 at a position adjacent, in the width direction (X-direction in the drawing), to the transfer regions M1 to M6 in the left sub-block B21. The delivery tower 31 is provided to extend across the first to sixth layer blocks P1 to P6 in the right sub-block B22.

In the delivery tower 31, a plurality of delivery modules are layered in the up-down direction. In the delivery tower 31, the delivery modules are provided at height positions corresponding to respective layer blocks such as the first to sixth layer blocks L1 to L6 and the first to sixth layer blocks P1 to P6. More specifically, in the delivery tower 31, delivery modules TRS21, CPL21 are provided at positions corresponding to the first layer block L1 and the first layer block P1. Similarly, delivery modules TRS23 to TRS26 and CPL23 to CPL26 are provided at positions corresponding to the second to sixth layer blocks L2 to L6 and the second to sixth layer blocks P2 to P6.

Further, in the delivery tower 31, a delivery module TRS20 is provided at a height position accessible from a later-explained wafer transfer mechanism Q51. The delivery module TRS20 is used, for example, in transferring the wafer W from the right sub-block B22 into the left sub-block B21. Besides, the delivery module TRS20 is at almost the same height position as a later-explained delivery box 33.

Further, in the right sub-block B22, as illustrated in FIG. 1, a wafer transfer mechanism 32 is provided on the deep side (Y-direction positive side in the drawing) of the delivery tower 31. The wafer transfer mechanism 32 has a transfer arm 32a which is configured to freely move back and forth and freely move up and down, and thus can transfer the wafer W among the delivery modules in the delivery tower 31.

In the first layer block P1 in the right sub-block B22, a transfer region Q1 extending in the width direction (X-direction in the drawing) from the delivery tower 31 is formed at the middle in the depth direction (Y-direction in the drawing).

Three resist film forming modules COT1 are provided along the width direction in a region on the near side (Y-direction negative side in the drawing) of the transfer region Q1 in the first layer block P1, and vertical units U11 to U14 having treatment modules are provided in a region on the deep side (Y-direction positive side in the drawing) of the transfer region Q1.

Each of the resist film forming modules COT1 forms a resist film on the wafer W on which the anti-reflection film has been formed. The resist film forming module COT1 also has a spin chuck 21 and a cup 22 similarly to the anti-reflection film forming module BCT1. Further, a nozzle 23 is provided which is shared among the resist film forming modules COT1. Note that from the nozzle 23 for the resist film forming modules COT1, a resist solution for forming the resist film is discharged.

The vertical units U11 to U14 are provided in this order from the left side (X-direction negative side in the drawing) along the width direction. Each of the vertical units U11 to U14 has heating modules each of which performs a heat treatment on the wafer W, and the heating modules are layered, for example, at two upper and lower stages in each of the units.

Further, in the first layer block P1, a wafer transfer mechanism Q11 is provided in the transfer region Q1. The wafer transfer mechanism Q11 has a transfer arm Q11a configured to freely move back and forth, freely move up and down, freely rotate around a vertical axis, and freely move in a width direction (X-direction in the drawing), and can deliver the wafer W among the modules in the first layer block P1. The transfer arm Q11a can get access also to the delivery tower 31.

The second layer block P2 is configured similarly to the first layer block P1. Note that a transfer region provided in the second layer block P2 is denoted by Q2, resist film forming modules are denoted by COT2, and vertical units are denoted by U21 to U24 in the drawing and the like. Further, a wafer transfer mechanism provided in the transfer region Q2 is denoted by Q21, and a transfer arm of the wafer transfer mechanism Q21 is denoted by Q21a.

In the third layer block P3, a transfer region Q3 extending in the width direction (X-direction in the drawing) from the delivery tower 31 is formed as illustrated in FIG. 4. The transfer region Q3 is provided at the middle in the depth direction (Y-direction in the drawing).

Three protective film forming modules ITC1 are provided along the width direction in a region on the near side (Y-direction negative side in the drawing) of the transfer region Q3 in the third layer block P3, and vertical units U31 to U34 having treatment modules are provided in a region on the deep side (Y-direction positive side in the drawing) of the transfer region Q3.

Each of the protective film forming modules ITC1 forms a water-repellent protective film on the wafer W on which the resist film has been formed. The protective film forming module ITC1 also has a spin chuck 21 and a cup 22 similarly to the anti-reflection film forming module BCT1. Further, a nozzle 23 is provided which is shared among the protective film forming modules ITC1. Note that from the nozzle 23 for the protective film forming modules ITC1, a treatment solution for forming the protective film is discharged.

The vertical units U31 to U34 are provided in this order from the left side (X-direction negative side in the drawing) along the width direction. Each of the vertical units U31 to U34 has heating modules each of which performs a heat treatment on the wafer W, and the heating modules are layered, for example, at two upper and lower stages in each of the units. The vertical unit U34 has a module (inspection module WES) which inspects the wafer W after the formation of the protective film and performs edge exposure on the wafer W, and the module has an imaging unit which images the front surface of the wafer W, a light source for edge exposure and so on.

Further, in the third layer block P3, a wafer transfer mechanism Q31 is provided in the transfer region Q3. The wafer transfer mechanism Q31 has a transfer arm Q31a configured to freely move back and forth, freely move up and down, freely rotate around a vertical axis, and freely move in the width direction (X-direction in the drawing), and can deliver the wafer W among the modules in the third layer block P3. The transfer arm Q31a can get access also to the delivery tower 31.

The fourth layer block P4 is configured similarly to the third layer block P3. Note that a transfer region provided in the fourth layer block P4 is denoted by Q4, protective film forming modules are denoted by ITC2, and vertical units are denoted by U41 to U44 in the drawing and the like. Further, a wafer transfer mechanism provided in the transfer regions Q4 is denoted by Q41, and a transfer arm of the wafer transfer mechanism Q41 is denoted by Q41a.

In the fifth layer block P5, as illustrated in FIG. 4, a transfer region Q5 extending in the width direction (X-direction in the drawing) from the delivery tower 31 is formed. The transfer region Q5 is formed at the middle in the depth direction (Y-direction in the drawing) as illustrated in FIG. 7.

A pre-exposure cleaning module BST1 as a pre-exposure treatment module is provided in a region on the near side (Y-direction negative side in the drawing) of the transfer region Q5 in the fifth layer block P5, but no treatment module is provided in a region on the deep side (Y-direction positive side in the drawing) of the transfer region Q5. In the region on the deep side, for example, a later-explained drive mechanism for driving the transfer mechanism Q51 is provided. Note that in the region on the near side of the transfer region Q5, three pre-exposure cleaning modules BST1 are provided along the width direction (X-direction in the drawing) as illustrated in FIG. 2.

Each of the pre-exposure cleaning modules BST1 cleans the wafer W on which the protective film has been formed, more specifically, cleans the rear surface of the wafer W. The pre-exposure cleaning module BST1 also has a spin chuck 21 and a cup 22 similarly to the anti-reflection film forming module BCT1. However, a nozzle 23 which supplies a treatment solution to the front surface of the wafer W held on the spin chuck 21 is not provided for the pre-exposure cleaning modules BST1, and the nozzle 23 is not provided outside the cup 22. Not that, though not illustrated, a nozzle which supplies a cleaning solution to the rear surface and a bevel portion of the wafer W whose front surface is directed upward and cleans them, is provided only inside or at a lower part of the cup 22 for the pre-exposure cleaning modules BST1.

Further, the pre-exposure cleaning module BST1 is smaller in pitch between modules in the width direction (X-direction in the drawing) than the coating film forming treatment modules (namely, the resist film forming modules COT1, COT2 or the protective film forming modules ITC1, ITC2) which are provided in the same sub-block. More specifically, the pre-exposure cleaning modules BST1 have a smaller pitch in the width direction of the spin chucks 21 or the cups 22 than that of the resist film forming modules COT1, COT2 or the protective film forming modules ITC1, ITC2. Since the nozzle 23 is not provided for the pre-exposure cleaning modules BST1 as explained above, there is no need to provide a waiting section where the nozzle 23 waits or the like at the time of other than the solution treatment, so that the pitch between modules in the width direction can be decreased.

In addition to the small pitch between modules in the width direction of the pre-exposure cleaning modules BST1, the transfer region Q5 in the fifth layer block P5 is smaller in length in the width direction, namely, in width than the transfer regions Q1 to Q4 as illustrated in FIG. 4. Further, in the transfer region Q5, the wafer transfer mechanism Q51 which is shared with a later-explained transfer region Q6 in the sixth layer block P6 is provided. The wafer transfer mechanism Q51 has a transfer arm Q51a configured to freely move back and forth, freely move up and down, freely rotate around a vertical axis, and freely move in the width direction (X-direction in the drawing).

In the sixth layer block P6, as illustrated in FIG. 8, the transfer region Q6 extending in the width direction (X-direction in the drawing) from the delivery tower 31 is formed at the middle in the depth direction (Y-direction in the drawing).

Three pre-exposure cleaning modules BST2 are provided along the width direction in a region on the near side (Y-direction negative side in the drawing) of the transfer region Q6 in the sixth layer block P6, and three pre-exposure cleaning modules BST3 are provided along the width direction also in a region on the deep side (Y-direction positive side in the drawing) of the transfer region Q6.

The pre-exposure cleaning modules BST2, BTS3 are small in pitch between modules in the width direction similarly to the pre-exposure cleaning modules BST1.

Further, the transfer region Q6 in the sixth layer block P6 is smaller in width than the transfer regions Q1 to Q4 similarly to the transfer region Q5 in the fifth layer block P5. Further, in the transfer region Q6, the wafer transfer mechanism Q51 shared with the fifth layer block P5 is provided as explained above. The wafer transfer mechanism Q51 can transfer the wafer W, using the above transfer arm Q51a, between the delivery tower 31 and the pre-exposure cleaning modules BST1 to BST3, between the pre-exposure cleaning modules BST1 to BST3 and the later-explained delivery box 33, and between the box 33 and the delivery tower 31.

Further, in the sixth layer block P6, the delivery box 33 as a deliverer is provided at the end on the interface block B3 side (X-direction positive side in the drawing). The delivery box 33 is provided in a region, adjacent to the interface block B3 side (X-direction positive side in the drawing), of the transfer region Q6 in the sixth layer block P6. In the delivery box 33, delivery modules TRS31 are provided in layers as illustrated in FIG. 4.

In the interface block B3, as illustrated in FIG. 9, a wafer transfer mechanism 41 as a first transfer-in/out module which transfers the wafer W into/out of the exposure apparatus E is provided in a relay side transfer region R1. The relay side transfer region R1 will be explained later The wafer transfer mechanism 41 has a transfer arm 41a configured to freely move back and forth, freely move up and down, freely rotate around a vertical axis, and freely move in the depth direction (Y-direction in the drawing). The wafer transfer mechanism 41 can transfer the wafer W using the transfer arm 41a between a later-explained delivery tower 51 and the exposure apparatus E.

Further, in the interface block B3, post-exposure cleaning modules PIR as post-exposure treatment modules are provided in layers. The post-exposure cleaning module PIR cleans the wafer W after liquid-immersion exposure, more specifically, removes the protective film formed on the front surface of the wafer W and cleans the front surface. The post-exposure cleaning module PIR also has a spin chuck 21 and a cup 22 similarly to the anti-reflection film forming module B CT1. Further, though not illustrated, a nozzle is provided which supplies a treatment solution to the front surface of the wafer W similarly to the anti-reflection film forming module BCT1. However, from the nozzle, a treatment solution for removing or for cleaning the protective film is discharged.

The post-exposure cleaning module PIR has a housing in a rectangular parallelepiped shape, and is arranged so that its longitudinal direction matches with the depth direction (Y-direction in the drawing) of the coating and developing apparatus 1.

Further, in the interface block B3, a wafer transfer mechanism 42 is provided as a second transfer-in/out module which transfers the wafer W into/out of the delivery box 33 in the right sub-block B22 and the post-exposure cleaning module PIR. The wafer transfer mechanism 42 is provided in a region adjacent, in the width direction (X-direction in the drawing), to the delivery box 33 as illustrated in FIG. 4. More specifically, the wafer transfer mechanism 42 is provided such that the transfer region Q5 or the transfer region Q6 and the delivery box 33 in the right sub-block B22, and the wafer transfer mechanism 42 are arranged side by side along the width direction in plan view as illustrated in FIG. 8. The wafer transfer mechanism 42 has a transfer arm 42a configured to freely move back and forth, freely move up and down, and freely rotate around a vertical axis. The wafer transfer mechanism 42 can transfer the wafer W using the transfer arm 42a between the delivery box 33 and the later-explained delivery tower 51, between the delivery tower 51 and the post-exposure cleaning module PIR, and between the post-exposure cleaning module PIR and the delivery box 33.

Here, the relay side transfer region R1 where the wafer transfer mechanism 41 is provided will be explained.

The relay side transfer region R1 is a region, as illustrated in FIG. 1 and FIG. 9, extending from a region which overlaps with the wafer transfer mechanism 42 only in plan view but does not overlap therewith in the up-down direction, to the near side in the depth direction (Y-direction negative side in the drawing) along the side surface of the exposure apparatus E. In this embodiment, the relay side transfer region R1 extends from a region at a lower part of the middle in the depth direction of the interface block B3 to the end on the near side in the depth direction. Note that there are various types of exposure apparatuses E, and therefore the relay side transfer region R1 needs to be made large, to some extent, in length in the depth direction in order to be made applicable to the various types of exposure apparatuses E.

The post-exposure cleaning modules PIR are provided in a region adjacent, in the up-down direction, to the relay side transfer region R1 and adjacent, in the depth direction (Y-direction in the drawing), to the wafer transfer mechanism 42. More specifically, the plurality of post-exposure cleaning modules PIR are layered in a region adjacent to the upper side of the relay side transfer region R1 and adjacent to the near side of the wafer transfer mechanism 42.

Furthermore, the interface block B3 has a relay mechanism 50 which relays the wafer W between the wafer transfer mechanism 41 and the wafer transfer mechanism 42 as illustrated in FIG. 9. The relay mechanism 50 is provided in a region on the deep side (Y-direction positive side in the drawing) facing the post-exposure cleaning modules PIR with the wafer transfer mechanism 42 interposed therebetween in the depth direction (Y-direction in the drawing).

The relay mechanism 50 has the delivery tower 51 as a layered deliverer and a wafer transfer mechanism 52 as an up-down direction transfer mechanism which are arranged side by side in this order from the near side (Y-direction negative side in the drawing) along the depth direction.

In the delivery tower 51, delivery modules into/out of which the wafer W is transferred by the wafer transfer mechanism 41 and delivery modules into/out of which the wafer W is transferred by the wafer transfer mechanism 42 are layered in the up-down direction. More specifically, in the delivery tower 51, delivery modules TRS41 and a delivery module SBU are layered at upper positions accessible from the wafer transfer mechanism 41, and delivery modules TRS42 and delivery modules CPL41 are layered at lower positions accessible from the wafer transfer mechanism 42. Note that the delivery module SBU is configured to be able to store and retain a plurality of wafers W.

The wafer transfer mechanism 52 has a transfer arm 52a which is configured to freely move back and forth and freely move up and down, and can deliver the wafer W among the delivery modules in the delivery tower 51.

The coating and developing apparatus 1 configured as above has a controller 100. The controller 100 is a computer including, for example, a CPU, a memory, and so on, and has a program storage (not illustrated). In the program storage, programs for controlling the operations of drive systems of the various treatment modules, the wafer transfer mechanisms and so on to perform various treatments on the wafer W are stored. Note that the programs may be the ones which are recorded on a computer-readable storage medium and installed from the storage medium into the controller 100. Some or all of the programs may be realized by dedicated hardware (circuit board).

Next, the coating and developing treatments performed using the coating and developing apparatus 1 configured as above will be explained.

First, the carrier C housing a plurality of wafers W is transferred into the carrier block B1 of the coating and developing apparatus 1, and the wafers W in the carrier C are transferred in sequence by the wafer transfer mechanism 13 into the delivery modules TRS1 in the delivery box 14.

Next, the wafer W is transferred by the wafer transfer mechanism 16 into the inspection module IN-WIS, and the inspection of the wafer W before the coating and developing treatments is performed using the inspection module IN-WIS.

Subsequently, the wafer W is transferred by the wafer transfer mechanism 16 to the delivery module TRS10 in the delivery tower 15, and thereafter transferred by the wafer transfer mechanism 17, for example, to the delivery module TRS11.

The wafer W is next transferred by the wafer transfer mechanism M11 into the first layer block L1 in the left sub-block B21 of the treatment block B2, and transferred, for example, to the vertical unit T12 (hydrophobic treatment module) and subjected to a hydrophobic treatment. The wafer W is thereafter transferred by the wafer transfer mechanism M11 in the order of the delivery module CPL11→the anti-reflection film forming module BCT1→→the vertical unit T13 (thermal treatment module)→the vertical unit T11 (inspection module WIS-B). Thus, an anti-reflection film is formed on the wafer W, and the inspection of the wafer W using the inspection module WIS-B is performed.

Subsequently, the wafer W is transferred by the wafer transfer mechanism M11 to the delivery module TRS21 in the delivery tower 31, and transferred into the first layer block P1 in the right sub-block B22 of the treatment block B2. The wafer W is thereafter transferred by the wafer transfer mechanism Q11 in the order of the delivery module CPL21→the resist film forming module COT1→the vertical unit U11 (thermal treatment module)→the delivery module TRS21. Thus, a resist film is formed on the anti-reflection film on the wafer W. As explained above, the layer block used for the formation of the anti-reflection film in the left sub-block B21 and the layer block used for the formation of the resist film in the right sub-block B22 are at the same height position in the coating and developing apparatus 1.

Subsequently, the wafer W is transferred by the wafer transfer mechanism 32, for example, to the delivery module CPL23 and transferred into the third layer block P3. The wafer W is then transferred by the wafer transfer mechanism Q31 in the order of the protective film forming module ITC1→the vertical unit U31 (thermal treatment module)→the vertical unit U34 (inspection module WES)→the delivery module TRS23. Thus, a protective film is formed on the resist film on the wafer W, and the inspection of the wafer W and the edge exposure on the wafer W using the inspection module WES are performed.

Note that, for example, the vertical units U13, U14, U23, U24 in the first and second layer blocks P1, P2 may be configured to have the inspection module WES and perform the inspection of the wafer W and the edge exposure on the wafer W not after the formation of the protective film but before the formation of the protective film and after the formation of the resist film.

Subsequently, the wafer W is transferred by the wafer transfer mechanism 32, for example, to the delivery modules TRS26 and transferred into the sixth layer block P6. The wafer W is then transferred by the wafer transfer mechanism Q51, for example, to the pre-exposure cleaning module BST2, and the rear surface of the wafer W is cleaned. Thereafter, the wafer W is transferred by the wafer transfer mechanism Q51 to the delivery modules TRS31 in the delivery box 33.

Subsequently, the wafer W is transferred by the wafer transfer mechanism 42 to the delivery module SBU in the delivery tower 51, and transferred into the interface block B3. The wafer W is then transferred by the wafer transfer mechanism 52 to the delivery module CPL41. The wafer W is then transferred by the wafer transfer mechanism 41 to the exposure apparatus E and subjected to liquid-immersion exposure.

After the liquid-immersion exposure, the wafer W is then transferred by the wafer transfer mechanism 42 to the delivery module TRS42 in the delivery tower 51. The wafer W is then transferred by the wafer transfer mechanism 52 to the delivery module TRS41. The wafer W is then transferred by the wafer transfer mechanism 42 in the order of the post-exposure cleaning module PIR→the delivery box 33. Thus, the removal and cleaning of the protective film for the wafer W after the liquid-immersion exposure, and the wafer W is transferred again into the treatment block B2.

Subsequently, the wafer W is transferred by the wafer transfer mechanism Q51 to the delivery modules TRS20 in the delivery tower 31 adjacent to the left sub-block B21. In other words, when the wafer W is transferred to the left sub-block B21, the wafer transfer mechanism Q51 in the fifth and sixth layer block P5, P6 in which the pre-exposure cleaning modules are provided is used.

Next, the wafer W is transferred by the wafer transfer mechanism 32, for example, to the delivery modules TRS23 in the delivery tower 31. Subsequently, the wafer W is transferred by the wafer transfer mechanism M31 into the third layer block L3 in the left sub-block B21, and transferred, for example, to the vertical unit T32 (thermal treatment module) and subjected to a PEB treatment. The wafer W is thereafter transferred by the wafer transfer mechanism M31 in the order of the delivery module CPL23→the developing module DEV1→the vertical unit T33 (thermal treatment module)→the vertical unit T31 (inspection module OUT-WIS). Thus, the developing treatment is performed on the wafer W, so that a resist pattern is formed on the wafer W and the inspection of the wafer W after the development is performed using the inspection module OUT-WIS. Note that, after the inspection, the wafer W is transferred by the wafer transfer mechanism M31 to the delivery module CPL13 and transferred out of the treatment block B2.

Next, the wafer W is transferred by the wafer transfer mechanism 17 to the delivery modules TRS10. Subsequently, the wafer W is transferred by the wafer transfer mechanism 16 to the adjustment inspection apparatus M and inspected by the adjustment inspection apparatus M. After the inspection, the wafer W is transferred by the wafer transfer mechanism 16 to the delivery module TRS in the delivery box 14 and thereafter returned by the wafer transfer mechanism 13 into the carrier C.

As explained above, in this embodiment, the coating and developing apparatus 1 includes the treatment block B2 in which the treatment modules including the pre-exposure cleaning modules BST1 to 3 are provided, and the interface block B3 in which the post-exposure cleaning modules PIR and the wafer transfer mechanism 41 are provided and which couples the treatment block B2 and the exposure apparatus E in the width direction. Further, the treatment block B2 is multilayered in the up-down direction, the treatment modules are provided in each layer block, and the wafer transfer mechanisms M11 to M61, Q11 to Q51 are provided in the transfer regions M1 to M6, Q1 to Q6 extending in the width direction. Further, in the treatment block B2, (A) the delivery box 33 where the wafer W is mounted when the wafer W is delivered between both the blocks is provided at the end on the interface block B3 side in the layer blocks in which the pre-exposure cleaning modules BST1 to 3 are provided, and in the treatment block B3, (B) the wafer transfer mechanism 42 which transfers the wafer into/out of the delivery box 33 and the post-exposure cleaning module PIR is provided in the region adjacent, in the width direction, to the delivery box 33 in the treatment block B2, (C) the wafer transfer mechanism 41 is provided in the relay side transfer region R1 extending in the depth direction from the region which overlaps, in plan view, with the wafer transfer mechanism 41, (D) the post-exposure cleaning modules PIR are provided in the region, which may be a dead space, adjacent, in the up-down direction, to the relay side transfer region R1 and adjacent, in the depth direction, to the wafer transfer mechanism 42, and (E) the relay mechanism which relays the wafer W between the wafer transfer mechanism 41 and the wafer transfer mechanism 42 is provided in the region facing the post-exposure cleaning modules PIR with the wafer transfer mechanism 42 interposed therebetween in the depth direction.

In other words, in the coating and developing apparatus 1 according to this embodiment, the region where the post-exposure cleaning modules PIR are provided and the region where the wafer transfer mechanism 41 which transfers the wafer W into/out of the exposure apparatus E overlap with each other in plan view. In contrast to the above, in the substrate treatment apparatus in Japanese Laid-open Patent Publication No. 2010-219434, the treatment part, the cleaning and drying treatment block in which the cleaning and drying treatment part for cleaning the substrate before the exposure treatment or the like is provided, the transfer-in and transfer-out block in which the substrate transfer mechanism with respect to the exposure apparatus is provided, and the exposure apparatus are arranged in parallel along the first direction, and both the blocks are not overlapped with each other in plan view. As compared with the configuration of Japanese Laid-open Patent Publication No. 2010-219434, the region where the post-exposure cleaning modules PIR are provided and the region where the wafer transfer mechanism 41 which transfers the wafer W into/out of the exposure apparatus E overlap with each other in plan view in this embodiment, so that it is possible to decrease the occupied floor area of the apparatus.

Figure 10:
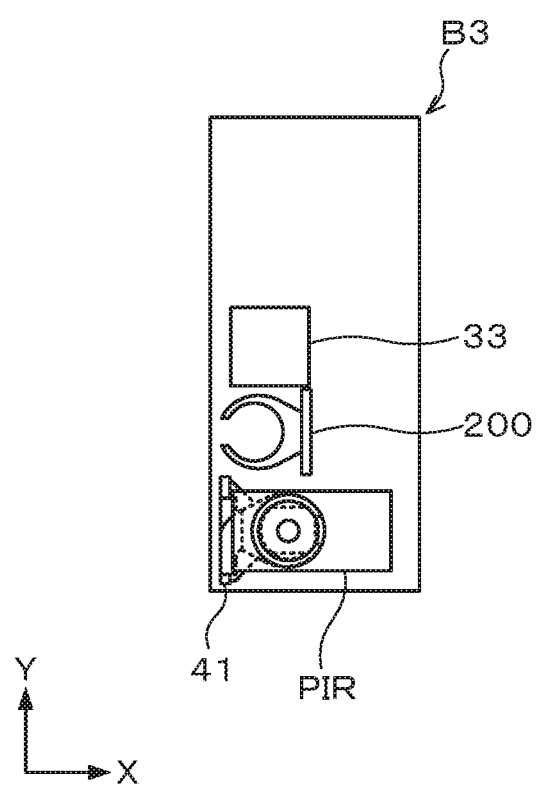
FIG. 10 is a view for explaining the effect of the embodiment.

Further, in this embodiment, the delivery box 33 is provided at the end on the interface block B3 side in the layer blocks in which the pre-exposure cleaning modules BST1 to 3 are provided as in the above (A). Therefore, the transfer regions Q1 to Q6, the delivery box 33, and the wafer transfer mechanism 42 can be arranged side by side along the width direction in plan view without increasing the width of the apparatus. A case in which the delivery box 33 exists on the interface block B3 side as illustrated in FIG. 10 unlike this embodiment is considered. In this case, for example, if a transfer mechanism 200 for delivering the wafer W between the delivery box 33 and the post-exposure cleaning module PIR is arranged such that the post-exposure cleaning module PIR, the transfer mechanism 200, and the delivery box 33 are arranged side by side along the depth direction (Y-direction in the drawing), the increase in size of the apparatus in the depth direction can be prevented. However, in the above arrangement, the transfer mechanism 200 is located on the near side (Y-direction negative side in the drawing) in the depth direction. In that case, for example, when the post-exposure cleaning module PIR has a housing in a rectangular parallelepiped shape and the module PIR is provided above the wafer transfer mechanism 41, the apparatus may become large in the width direction (X-direction in the drawing). In contrast to this, the wafer transfer mechanism 42 corresponding to the transfer mechanism 200 can be made to be arranged side by side with the transfer regions Q1 to Q6 and the delivery box 33 along the width direction in plan view in this embodiment. In other words, the wafer transfer mechanism 42 can be provided at the middle in the depth direction. Therefore, even in the case where the post-exposure cleaning module PIR has a housing in a rectangular parallelepiped shape, the apparatus never becomes large in the width direction when the post-exposure cleaning module PIR is provided above the wafer transfer mechanism 41.

Further, the treatment block B2 is multilayered in the up-down direction, the treatment modules are provided in each layer block, and therefore the number of treatment modules is large as explained above in this embodiment. Therefore, the coating and developing apparatus 1 can perform treatments at high throughput.

As explained above, according to this embodiment, it is possible to provide a coating and developing apparatus capable of performing treatments at high throughput and having a small occupied area.

Further, in this embodiment, the layer blocks in which the pre-exposure cleaning modules BST1 to 3 are provided are the fifth layer block P5 and the sixth layer block P6 which are layered, and the wafer transfer mechanism Q51 is shared between the fifth layer block P5 and the sixth layer block P6. Since the pre-exposure cleaning module does not need to perform the thermal treatment after the treatment unlike the case of performing the treatment for forming a coating film such as the resist film, the frequency of use of the wafer transfer mechanism Q51 for the pre-exposure cleaning module is low. Accordingly, the sharing of the wafer transfer mechanism Q51 between the layer blocks P5 and P6 of the pre-exposure cleaning modules can achieve effective use of the mechanism Q51. Further, the provision of the pre-exposure cleaning modules BST2, BST3 on both the near side and the deep side in the depth direction with the transfer region Q6 interposed therebetween as in the sixth layer block P6 can achieve effective use of the wafer transfer mechanism Q51.

Further, the coating film forming modules such as the resist film forming modules COT1, COT2 and the developing modules DEV1 to DEV4 are provided not in the layers in which one wafer transfer mechanism can be shared with the pre-exposure cleaning modules BST1 to BST3. In other words, the coating film forming modules such as the resist film forming modules COT1, COT2 and the developing modules DEV1 to DEV4 are provided in the layers in which the wafer transfer mechanisms different from that for the pre-exposure cleaning modules BST1 to BST3. This makes it possible to prevent an increase in load on the wafer transfer mechanism Q51 for the pre-exposure cleaning modules BST1 to BST3 and perform the smooth transfer to the pre-exposure cleaning modules BST1 to BST3 even if many pre-exposure cleaning modules BST1 to BST3 are installed.

Note that the wafer transfer mechanism may be provided in each of the layer blocks P5 and P6 where the pre-exposure cleaning modules are provided. Further, the delivery box 33 is shared between the layer blocks P5 and P6 in this embodiment, but may be provided in each of the layer blocks P5 and P6.

Further, in this embodiment, when the wafer W after the liquid-immersion exposure is transferred from the delivery box 33 in the right sub-block B22 to the left sub-block B21, the wafer transfer mechanism Q51 in the layer blocks P5 and P6 in which the pre-exposure cleaning modules are provided is used. Accordingly, the wafer transfer mechanism Q51 can be further effectively used. Further, since another wafer transfer mechanism is unnecessary, the cost of manufacturing the apparatus can be reduced.

Furthermore, in this embodiment, the layer block used for the formation of the anti-reflection film in the left sub-block B21 and the layer block used for the formation of the resist film in the right sub-block B22 are at the same height position. Accordingly, a process unnecessary between the formation of the anti-reflection film and the formation of the resist film, for example, a process of moving the wafer W in the height direction using the wafer transfer mechanism 32 can be omitted. Therefore, according to this embodiment, the treatments can be performed at higher throughput.

Further, in the left sub-block B21, the vertical units T31, T41, T51, T61 each having the inspection module OUT-WIS are provided on the side opposite to the right sub-block B22, namely, on the carrier block B1 side in the layer blocks L3 to L6 in which the developing modules are provided in this embodiment. Accordingly, the inspection module OUT-WIS is provided on the path for transferring the wafer W after the developing treatment to the carrier block B1 or the like for subsequent processes, thus making it possible to reduce the time period from the finish of the development to the transfer of the wafer W out to the carrier block B1 after undergoing the inspection in the inspection module OUT-WIS. Accordingly, the coating and developing treatments can be performed at higher throughput.

Further, in this embodiment, the layer block P6 including the pre-exposure cleaning modules BST2, BST3 as the pre-exposure treatment modules and the delivery box 33 is provided at the height position overlapping, in side view, with the region where the post-exposure cleaning modules PIR are arranged adjacent, in the up-down direction, to the wafer transfer mechanism 41. Therefore, the necessary drive ranges of the wafer transfer mechanism 41 and the wafer transfer mechanism 42 in the interface block B3 are clearly vertically separated, so that the arrangement of the drive mechanisms in the interface block B3 can be made simple and compact.

Further, in this embodiment, the wafer W passes only through the layer blocks P5 and P6 in which the pre-exposure delivery box 33 is accessible from the wafer transfer mechanism Q51 at the time of delivery of the wafer W between the interface block B3 and the treatment block B2. More specifically, at the time of delivery of the wafer W from the right sub-block B22 of the treatment block B2 to the interface block B3 and at the time of delivery of the wafer W from the interface block B3 to the left sub-block B21 via the right sub-block B22, the wafer W passes only through the layer blocks P5 and P6 in which the pre-exposure delivery box 33 is accessible from the wafer transfer mechanism Q51. Accordingly, the wafer W can be delivered between the interface block B3 and the treatment block B2 not using the wafer transfer mechanism Q11 high in frequency or time of use which is provided in the layer block P1 or the like but using the wafer transfer mechanism Q51 low in frequency of use which is provided for the layer blocks P5 and P6. As above, in this embodiment, the wafer transfer mechanism high in frequency of use for the wafer transfer in the same layer such as the wafer transfer mechanism Q11 in the layer block P1 is not used for the delivery of the wafer W with respect to the interface block B3, thus avoiding a further increase in frequency or time of use of the wafer transfer mechanism, which is preferable in terms of throughput.

Note that the vertical units T11, T21 each having the inspection module WIS-B which inspects the wafer W after the formation of the anti-reflection film are provided on the carrier block B1 side in this embodiment, but may be provided on the right sub-block B22 side. This can reduce the time period from the finish of the formation of the anti-reflection film to the transfer of the wafer W out to the right sub-block B22 after undergoing the inspection in the inspection module WIS-B.

Further, the vertical units U34, U44 each having the inspection module WES are provided on the interface block B3 side in this embodiment, but may be provided on the left sub-block B21 side.

The treatment block B2 is composed of two sub-blocks in the above example, but may be composed of three or more sub-blocks. Alternatively, the treatment block B2 may be composed of one block.

Further, the pre-exposure cleaning modules and the post-exposure cleaning modules are provided in the upper-most layer in the treatment block B2 and the interface block B3 in the above example, but other treatment module may be provided on the pre-exposure cleaning modules and the post-exposure cleaning modules.

Since the wafer transfer-in/out port on the exposure apparatus E side is located at a lower part in the above example, the wafer transfer mechanism 41 is provided at a lower part, and the wafer transfer mechanism 42, the post-exposure cleaning modules PIR, and the pre-exposure cleaning modules are provided at an upper part. Therefore, when the wafer transfer-in/out port on the exposure apparatus E side is located at an upper part, the wafer transfer mechanism 41 may be provided at an upper part and the wafer transfer mechanism 42, the post-exposure cleaning modules PIR, and the pre-exposure cleaning modules may be provided at a lower part.

The embodiment disclosed herein is only an example in all respects and should not be considered to be restrictive. The above embodiment may be abbreviated, replaced, or changed in various forms without departing from the scope and spirit of the attached claims.

Note that the following configurations also belong to the technical scope of this disclosure.

(1) A coating and developing apparatus configured to form a resist film on a substrate, transfer the substrate to an exposure apparatus, and then perform a developing treatment on the substrate subjected to liquid-immersion exposure in the exposure apparatus, the coating and developing apparatus including:

a treatment block in which treatment modules including a pre-exposure treatment module configured to solution-treat the substrate after formation of a coating film including the resist film and before the liquid-immersion exposure are provided; and a relay block in which a post-exposure treatment module configured to solution-treat the substrate after the liquid-immersion exposure and before the developing treatment and a first transfer-in/out module configured to transfer the substrate into/out of the exposure apparatus are provided, and which couples the treatment block and the exposure apparatus in a width direction, wherein:

in the treatment block being multilayered in an up-down direction, the treatment module is provided in each of layers, a transfer mechanism configured to transfer the substrate is provided in a transfer region extending in the width direction, and a deliverer on which the substrate is mounted when the substrate is delivered between both the blocks is provided at an end on the relay block side in the layer in which the pre-exposure treatment module is provided; and in the relay block,
a second transfer-in/out module configured to transfer the substrate into/out of the deliverer and the post-exposure treatment module is provided in a region adjacent, in the width direction, to the deliverer in the treatment block,
the first transfer-in/out module is provided in a relay side transfer region extending in a depth direction perpendicular to the width direction from a region overlapping, in plan view, with the second transfer-in/out module,
the post-exposure treatment module is provided in a region adjacent, in the up-down direction, to the relay side transfer region and adjacent, in the depth direction, to the second transfer-in/out module, and
a relay mechanism configured to relay the substrate between the first transfer-in/out module and the second transfer-in/out module is provided in a region facing the post-exposure treatment module with the second transfer-in/out module interposed therebetween in the depth direction.

According to the (1), it is possible to provide a coating and developing apparatus capable of performing treatments at high throughput and having a small occupied area.

(2) The coating and developing apparatus according to the (1), wherein
the transfer region and the deliverer in the treatment block and the second transfer-in/out module in the relay block are arranged side by side along the width direction.

(3) The coating and developing apparatus according to the (1) or (2), wherein:
the layers in each of which the pre-exposure treatment module is provided are layered, and
the transfer mechanism for the pre-exposure treatment module is shared among the layers.

(4) The coating and developing apparatus according to the (3), wherein
the deliverer is provided only for one layer.

(5) The coating and developing apparatus according to any one of the (1) to (4), wherein
in the treatment block,
a coating film forming module configured to form the coating film includes a nozzle configured to discharge a solution for forming the coating film from above toward the substrate, and a waiting section for the nozzle, the nozzle and the waiting section being provided outside a cup configured to laterally surround the substrate on which the coating film is to be formed,
the pre-exposure treatment module includes a nozzle configured to supply a solution for performing the solution treatment to the substrate, the nozzle being provided only inside or at a lower part of a cup configured to laterally surround the substrate on which the solution treatment before the exposure is to be performed, and
the pre-exposure treatment module is smaller in pitch between modules in the width direction than the coating film forming module in the treatment block.

(6) The coating and developing apparatus according to any one of the (1) to (5), wherein
the treatment block includes a plurality of sub-blocks connected in the width direction.

(7) The coating and developing apparatus according to the (6), wherein
when a treatment is performed by the treatment module in one of the sub-blocks and subsequently a treatment is performed by the treatment block in another of the sub-blocks adjacent, in the width direction, to the one of the sub-blocks, the treatment modules provided in layers at the same height position are used in the one of the sub-blocks and the another of the sub-blocks.

(8) The coating and developing apparatus according to the (6) or (7), wherein
when the substrate after the liquid-immersion exposure is transferred from the deliverer in a sub-block in which the pre-exposure treatment module is provided to another sub-block, the transfer mechanism in the layer in which the pre-exposure treatment module is provided is used.

(9) The coating and developing apparatus according to any one of the (6) to (8), wherein:
a developing module configured to perform the developing treatment is provided in a second sub-block different from a first sub-block in which the pre-exposure treatment module is provided; and
in the second sub-block, an inspection module configured to inspect the substrate after the developing treatment is provided on a side opposite to the first sub-block, in a layer in which the developing module is provided.

(10) The coating and developing apparatus according to the (9), further including
a carrier block on which a carrier configured to house the substrate is mounted, the carrier block being provided on a side of the second sub-block opposite to the first sub-block.

(11) The coating and developing apparatus according to any one of the (1) to (10), wherein
a plurality of the treatment modules are provided along the width direction in each of one side region and another side region in the depth direction with the transfer region interposed therebetween in at least one of the layers in the treatment block.

(12) The coating and developing apparatus according to the (11), wherein
the pre-exposure treatment module is provided in each of the one side region and the another side region in the depth direction; and
a coating film forming module configured to form the coating film and a developing module configured to perform the developing treatment are provided in a layer in which a transfer mechanism different from the transfer mechanism for the pre-exposure treatment module is used.

(13) The coating and developing apparatus according to any one of the (1) to (12), wherein:
the pre-exposure treatment module is provided in an upper layer.

(14) The coating and developing apparatus according to any one of the (1) to (13), wherein
the relay mechanism includes:
a layered deliverer in which a module into/out of which the substrate is transferred by the first transfer-in/out module and a module into/out of which the substrate is transferred by the second transfer-in/out module are layered in the up-down direction; and
an up-down direction transfer mechanism configured to transfer the substrate between the modules in the layered deliverer.

(15) A coating and developing method using a coating and developing apparatus configured to form a resist film on a substrate, transfer the substrate to an exposure apparatus, and then perform a developing treatment on the substrate subjected to liquid-immersion exposure in the exposure apparatus, the coating and developing apparatus including:
a treatment block in which treatment modules including a pre-exposure treatment module configured to solution-treat the substrate after formation of a coating film including the resist film and before the liquid-immersion exposure are provided; and
a relay block in which a post-exposure treatment module configured to solution-treat the substrate after the liquid-immersion exposure and before the developing treatment and a first transfer-in/out module configured to transfer the substrate into/out of the exposure apparatus are provided, and which couples the treatment block and the exposure apparatus in a width direction, wherein:
in the treatment block being multilayered in an up-down direction,
the treatment module is provided in each of layers,
a transfer mechanism configured to transfer the substrate is provided in a transfer region extending in the width direction, and
a deliverer on which the substrate is mounted when the substrate is delivered between both the blocks is provided at an end on the relay block side in the layer in which the pre-exposure treatment module is provided; and
in the relay block,
a second transfer-in/out module configured to transfer the substrate into/out of the deliverer and the post-exposure treatment module is provided in a region adjacent, in the width direction, to the deliverer in the treatment block,
the first transfer-in/out module is provided in a relay side transfer region extending in a depth direction perpendicular to the width direction from a region overlapping, in plan view, with the second transfer-in/out module,
the post-exposure treatment module is provided in a region adjacent, in the up-down direction, to the relay side transfer region and adjacent, in the depth direction, to the second transfer-in/out module, and
a relay mechanism configured to relay the substrate between the first transfer-in/out module and the second transfer-in/out module is provided in a region facing the post-exposure treatment module with the second transfer-in/out module interposed therebetween in the depth direction,
the coating and developing method including:
the transfer mechanism transferring the substrate treated in the pre-exposure treatment module in the treatment block, to the deliverer;
thereafter the second transfer-in/out module transferring the substrate out of the deliverer;
thereafter the relay mechanism delivering the substrate from the second transfer-in/out module to the first transfer-in/out module;
thereafter the first transfer-in/out module transferring the substrate into the exposure apparatus;
after the liquid-immersion exposure in the exposure apparatus, the first transfer-in/out module transferring the substrate out of the exposure apparatus;
thereafter the relay mechanism delivering the substrate from the first transfer-in/out module to the second transfer-in/out module;
thereafter the second transfer-in/out module transferring the substrate into the post-exposure treatment module;
thereafter the second transfer-in/out module transferring the substrate out of the post-exposure treatment module and transferring the substrate into the deliverer; and
thereafter the transfer mechanism transferring the substrate out of the deliverer.

According to this disclosure, it is possible to provide a coating and developing apparatus capable of performing treatments at high throughput and having a small occupied area.

What is claimed is:

1. A coating and developing apparatus configured to form a resist film on a substrate, transfer the substrate to an exposure apparatus, and then perform a developing treatment on the substrate subjected to liquid-immersion exposure in the exposure apparatus, the coating and developing apparatus comprising:
a treatment block in which treatment modules including a pre-exposure treatment module configured to solution-treat the substrate after formation of a coating film including the resist film and before the liquid-immersion exposure are provided; and
a relay block in which a post-exposure treatment module configured to solution-treat the substrate after the liquid-immersion exposure and before the developing treatment and a first transfer-in/out module configured to transfer the substrate into/out of the exposure apparatus are provided, and which couples the treatment block and the exposure apparatus in a width direction, wherein:
in the treatment block being multilayered in an up-down direction,
the treatment module is provided in each of layers,
a transfer mechanism configured to transfer the substrate is provided in a transfer region extending in the width direction, and
a deliverer on which the substrate is mounted when the substrate is delivered between both the blocks is provided at an end on the relay block side in the layer in which the pre-exposure treatment module is provided; and
in the relay block,
a second transfer-in/out module configured to transfer the substrate into/out of the deliverer and the post-exposure treatment module is provided in a region adjacent, in the width direction, to the deliverer in the treatment block,
the first transfer-in/out module is provided in a relay side transfer region extending in a depth direction perpendicular to the width direction from a region overlapping, in plan view, with the second transfer-in/out module,
the post-exposure treatment module is provided in a region adjacent, in the up-down direction, to the relay side transfer region and adjacent, in the depth direction, to the second transfer-in/out module, and
a relay mechanism configured to relay the substrate between the first transfer-in/out module and the second transfer-in/out module is provided in a region facing the post-exposure treatment module with the second transfer-in/out module interposed therebetween in the depth direction.

2. The coating and developing apparatus according to claim 1, wherein
the transfer region and the deliverer in the treatment block and the second transfer-in/out module in the relay block are arranged side by side along the width direction.

3. The coating and developing apparatus according to claim 1, wherein:
the layers in each of which the pre-exposure treatment module is provided are layered, and
the transfer mechanism for the pre-exposure treatment module is shared among the layers.

4. The coating and developing apparatus according to claim 3, wherein
the deliverer is provided only for one layer.

5. The coating and developing apparatus according to claim 1, wherein
in the treatment block,
a coating film forming module configured to form the coating film comprises a nozzle configured to discharge a solution for forming the coating film from above toward the substrate, and a waiting section for the nozzle, the nozzle and the waiting section being provided outside a cup configured to laterally surround the substrate on which the coating film is to be formed,
the pre-exposure treatment module comprises a nozzle configured to supply a solution for performing the solution treatment to the substrate, the nozzle being provided only inside or at a lower part of a cup configured to laterally surround the substrate on which the solution treatment before the exposure is to be performed, and
the pre-exposure treatment module is smaller in pitch between modules in the width direction than the coating film forming module in the treatment block.

6. The coating and developing apparatus according to claim 1, wherein
the treatment block comprises a plurality of sub-blocks connected in the width direction.

7. The coating and developing apparatus according to claim 6, wherein
when a treatment is performed by the treatment module in one of the sub-blocks and subsequently a treatment is performed by the treatment block in another of the sub-blocks adjacent, in the width direction, to the one of the sub-blocks, the treatment modules provided in layers at the same height position are used in the one of the sub-blocks and the another of the sub-blocks.

8. The coating and developing apparatus according to claim 6, wherein
when the substrate after the liquid-immersion exposure is transferred from the deliverer in a sub-block in which the pre-exposure treatment module is provided to another sub-block, the transfer mechanism in the layer in which the pre-exposure treatment module is provided is used.

9. The coating and developing apparatus according to claim 6, wherein:
a developing module configured to perform the developing treatment is provided in a second sub-block different from a first sub-block in which the pre-exposure treatment module is provided; and
in the second sub-block, an inspection module configured to inspect the substrate after the developing treatment is provided on a side opposite to the first sub-block, in a layer in which the developing module is provided.

10. The coating and developing apparatus according to claim 9, further comprising
a carrier block on which a carrier configured to house the substrate is mounted, the carrier block being provided on a side of the second sub-block opposite to the first sub-block.

11. The coating and developing apparatus according to claim 1, wherein
a plurality of the treatment modules are provided along the width direction in each of one side region and another side region in the depth direction with the transfer region interposed therebetween in at least one of the layers in the treatment block.

12. The coating and developing apparatus according to claim 11, wherein:
the pre-exposure treatment module is provided in each of the one side region and the another side region in the depth direction; and
a coating film forming module configured to form the coating film and a developing module configured to perform the developing treatment are provided in a layer in which a transfer mechanism different from the transfer mechanism for the pre-exposure treatment module is used.

13. The coating and developing apparatus according to claim 1, wherein
the pre-exposure treatment module is provided in an upper layer.

14. The coating and developing apparatus according to claim 1, wherein
the relay mechanism comprises:
a layered deliverer in which a module into/out of which the substrate is transferred by the first transfer-in/out module and a module into/out of which the substrate is transferred by the second transfer-in/out module are layered in the up-down direction; and
an up-down direction transfer mechanism configured to transfer the substrate between the modules in the layered deliverer.

15. A coating and developing method using a coating and developing apparatus configured to form a resist film on a substrate, transfer the substrate to an exposure apparatus, and then perform a developing treatment on the substrate subjected to liquid-immersion exposure in the exposure apparatus,
the coating and developing apparatus comprising:
a treatment block in which treatment modules including a pre-exposure treatment module configured to solution-treat the substrate after formation of a coating film including the resist film and before the liquid-immersion exposure are provided; and
a relay block in which a post-exposure treatment module configured to solution-treat the substrate after the liquid-immersion exposure and before the developing treatment and a first transfer-in/out module configured to transfer the substrate into/out of the exposure apparatus are provided, and which couples the treatment block and the exposure apparatus in a width direction, wherein:
in the treatment block being multilayered in an up-down direction,
the treatment module is provided in each of layers,
a transfer mechanism configured to transfer the substrate is provided in a transfer region extending in the width direction, and
a deliverer on which the substrate is mounted when the substrate is delivered between both the blocks is provided at an end on the relay block side in the layer in which the pre-exposure treatment module is provided; and in the relay block,
- a second transfer-in/out module configured to transfer the substrate into/out of the deliverer and the post-exposure treatment module is provided in a region adjacent, in the width direction, to the deliverer in the treatment block,
- the first transfer-in/out module is provided in a relay side transfer region extending in a depth direction perpendicular to the width direction from a region overlapping, in plan view, with the second transfer-in/out module,
- the post-exposure treatment module is provided in a region adjacent, in the up-down direction, to the relay side transfer region and adjacent, in the depth direction, to the second transfer-in/out module, and
- a relay mechanism configured to relay the substrate between the first transfer-in/out module and the second transfer-in/out module is provided in a region facing the post-exposure treatment module with the second transfer-in/out module interposed therebetween in the depth direction, the coating and developing method comprising:

the transfer mechanism transferring the substrate treated in the pre-exposure treatment module in the treatment block, to the deliverer;

thereafter the second transfer-in/out module transferring the substrate out of the deliverer;

thereafter the relay mechanism delivering the substrate from the second transfer-in/out module to the first transfer-in/out module;

thereafter the first transfer-in/out module transferring the substrate into the exposure apparatus;

after the liquid-immersion exposure in the exposure apparatus, the first transfer-in/out module transferring the substrate out of the exposure apparatus;

thereafter the relay mechanism delivering the substrate from the first transfer-in/out module to the second transfer-in/out module;

thereafter the second transfer-in/out module transferring the substrate into the post-exposure treatment module;

thereafter the second transfer-in/out module transferring the substrate out of the post-exposure treatment module and transferring the substrate into the deliverer; and thereafter the transfer mechanism transferring the substrate out of the deliverer.

* * * * *